(12) United States Patent
Ha

(10) Patent No.: US 11,706,997 B2
(45) Date of Patent: *Jul. 18, 2023

(54) ELECTRONIC DEVICE AND METHOD FOR FABRICATING THE SAME

(71) Applicant: SK hynix Inc., Gyeonggi-do (KR)

(72) Inventor: Gayoung Ha, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/583,723

(22) Filed: Jan. 25, 2022

(65) Prior Publication Data

US 2022/0149273 A1 May 12, 2022

Related U.S. Application Data

(63) Continuation of application No. 16/897,671, filed on Jun. 10, 2020, now Pat. No. 11,251,361.

(30) Foreign Application Priority Data

Oct. 1, 2019 (KR) .......................... 10-2019-0121586

(51) Int. Cl.
| | |
|---|---|
| *G11C 11/16* | (2006.01) |
| *H10N 50/80* | (2023.01) |
| *H01F 41/32* | (2006.01) |
| *H01F 10/32* | (2006.01) |
| *H10B 61/00* | (2023.01) |
| *H10N 50/01* | (2023.01) |

(52) U.S. Cl.
CPC ........... *H10N 50/80* (2023.02); *G11C 11/161* (2013.01); *H01F 10/329* (2013.01); *H01F 10/3254* (2013.01); *H01F 10/3286* (2013.01); *H01F 41/32* (2013.01); *H10B 61/00* (2023.02); *H10N 50/01* (2023.02)

(58) Field of Classification Search
CPC ... H01L 43/0227; H01L 43/222; H01L 43/12; H01L 43/08; H01L 27/24; H01L 45/12; H01L 45/16; G11C 11/161; H01F 41/32; H01F 10/329; H01F 10/3286; H01F 10/3254
USPC .......................... 711/154, 159; 365/148, 158
See application file for complete search history.

(56) References Cited

U.S. PATENT DOCUMENTS

| | | |
|---|---|---|
| 8,969,982 B2 | 3/2015 | Xiao et al. |
| 9,515,252 B1 | 12/2016 | Annunziata et al. |
| 10,198,372 B2 | 2/2019 | Moon |
| 2010/0051895 A1* | 3/2010 | Hampton ............ H01L 45/1625 257/E47.001 |

(Continued)

*Primary Examiner* — Michael T Tran
(74) *Attorney, Agent, or Firm* — Perkins Coie LLP

(57) ABSTRACT

An electronic device may include a semiconductor memory, and the semiconductor memory may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof.

10 Claims, 22 Drawing Sheets

(56) References Cited

U.S. PATENT DOCUMENTS

| | | | |
|---|---|---|---|
| 2010/0255653 A1* | 10/2010 | Marsh | H01L 45/144 |
| | | | 257/E21.09 |
| 2011/0235217 A1 | 9/2011 | Chen et al. | |
| 2014/0061827 A1 | 3/2014 | Huang et al. | |
| 2014/0281231 A1 | 9/2014 | Lee et al. | |
| 2015/0060750 A1* | 3/2015 | Sung | H01L 45/122 |
| | | | 257/4 |
| 2015/0092481 A1 | 4/2015 | Lee et al. | |
| 2016/0373264 A1* | 12/2016 | Katoh | H01L 45/08 |
| 2017/0025599 A1 | 1/2017 | Kim et al. | |
| 2017/0110513 A1* | 4/2017 | Lee | G11C 13/0069 |
| 2017/0186812 A1* | 6/2017 | Lee | H01L 45/10 |
| 2017/0186813 A1* | 6/2017 | Kim | H01L 45/1233 |
| 2017/0243923 A1* | 8/2017 | Jeong | G11C 13/0004 |
| 2018/0040667 A1 | 2/2018 | Kim et al. | |
| 2018/0040808 A1 | 2/2018 | Nam | |
| 2018/0040809 A1 | 2/2018 | Moon | |
| 2018/0047899 A1* | 2/2018 | Horii | H01L 27/2481 |
| 2018/0061886 A1 | 3/2018 | Tokashiki | |
| 2018/0205002 A1 | 7/2018 | Bak | |
| 2018/0212147 A1* | 7/2018 | Ruiz | H01L 45/08 |
| 2018/0277753 A1* | 9/2018 | Yamamoto | H01L 45/1233 |
| 2018/0350432 A1 | 12/2018 | Sasaki | |
| 2019/0036014 A1 | 1/2019 | Ha | |
| 2019/0088318 A1* | 3/2019 | Morooka | H01L 45/1226 |
| 2019/0131516 A1 | 5/2019 | Park et al. | |
| 2019/0156891 A1 | 5/2019 | Kanda et al. | |
| 2019/0214546 A1 | 7/2019 | Ha | |
| 2019/0304523 A1* | 10/2019 | O'Brien | H01F 10/329 |
| 2019/0334080 A1 | 10/2019 | Ahmed et al. | |
| 2019/0371370 A1 | 12/2019 | Hanyu et al. | |
| 2020/0035906 A1* | 1/2020 | Shum | H10B 61/00 |
| 2020/0111954 A1* | 4/2020 | Kim | H01L 45/06 |
| 2020/0321639 A1* | 10/2020 | LaGrange | H01M 8/04149 |
| 2020/0350489 A1 | 11/2020 | Park et al. | |
| 2020/0364002 A1 | 11/2020 | Fujino et al. | |
| 2021/0013397 A1 | 1/2021 | O'brien et al. | |
| 2021/0083185 A1 | 3/2021 | Jung et al. | |
| 2021/0151505 A1 | 5/2021 | Han | |
| 2021/0201996 A1* | 7/2021 | Sakamoto | G11C 13/0064 |
| 2021/0296397 A1 | 9/2021 | Ko et al. | |

* cited by examiner

ELECTRONIC DEVICE AND METHOD FOR FABRICATING THE SAME

CROSS-REFERENCE TO RELATED APPLICATION

This patent document is a continuation of U.S. patent application Ser. No. 16/897,671, entitled "ELECTRONIC DEVICE AND METHOD FOR FABRICATING THE SAME" and filed on Jun. 10, 2020, now U.S. Pat. No. 11,251,361 issued on Feb. 15, 2022, which claims priority and benefits of Korean Patent Application No. 10-2019-0121586, entitled "ELECTRONIC DEVICE AND METHOD FOR FABRICATING THE SAME" and filed on Oct. 1, 2019, both of which are incorporated by reference as part of the disclosure of this application.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element that exhibits different resistance states for storing data.

In one aspect, an electronic device may include a semiconductor memory, and the semiconductor memory may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof.

In another aspect, an electronic device may include a semiconductor memory, and the semiconductor memory may include: a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; a blocking layer disposed on at least sidewalls of the variable resistance element; and a protective layer disposed on at least sidewalls of the blocking layer, wherein the blocking layer may include a layer that is substantially free of nitrogen, oxygen or a combination thereof.

In further another aspect, a method for fabricating an electronic device may include forming a variable resistance element over a substrate; and forming blocking layer on at least sidewalls of the variable resistance element, wherein the blocking layer may include a layer that is substantially free of nitrogen, oxygen or a combination thereof.

In further another aspect, a method for fabricating an electronic device may include forming a variable resistance element over a substrate; forming a blocking layer on at least sidewalls of the variable resistance element; and forming a protective layer on at least sidewalls of the blocking layer, wherein the blocking layer may include a layer that is substantially free of nitrogen, oxygen or a combination thereof.

These and other aspects, implementations and associated advantages are described in greater detail in the drawings, the description and the claims.

DETAILED DESCRIPTION

Figure 1A:
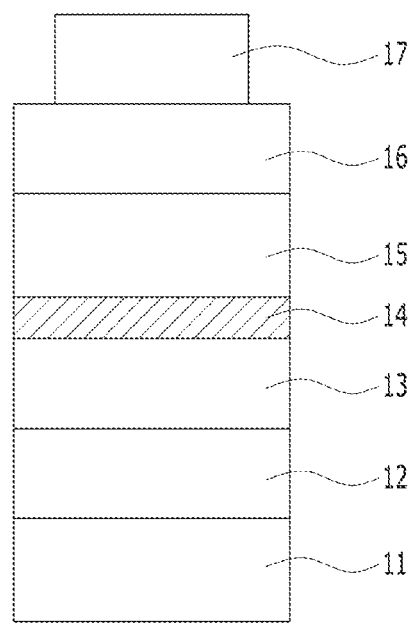
FIGS. 1A to 1D are cross-sectional views illustrating an example of a semiconductor memory and an example method for fabricating the memory device.

Various examples and implementations of the disclosed technology are described below in detail with reference to the accompanying drawings.

The drawings may not be necessarily to scale and in some instances, proportions of at least some of substrates in the drawings may have been exaggerated to illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

FIGS. 1A to 1D are cross-sectional views illustrating an example of a semiconductor memory and an example method for fabricating the memory device.

Referring to FIG. 1A, a material layer 12 for an under layer may be formed over a substrate 11 where a predetermined structure (not shown) is formed.

Then, a material layer 13 for a free layer, a material layer 14 for a tunnel barrier layer and a material layer 15 for a pinned layer may be sequentially formed over the material layer 12 for the under layer.

A material layer 16 for an upper layer may then be formed over the material layer 15 for the pinned layer.

A hard mask pattern 17 may be formed over the material layer 16 for the upper layer. The hard mask pattern 17 may be formed by patterning a material layer using a photoresist pattern (not shown) over the material layer 16 for the upper layer. For example, hard mask pattern 17 may be formed by etching the material layer using the photoresist pattern as an etch barrier.

Subsequently, the material layer 16 for the upper layer, the material layer 15 for the pinned layer, the material layer 14 for the tunnel barrier layer, the material layer 13 for the free layer and the material layer 12 for the under layer may be sequentially etched by using the hard mask pattern 17.

This etch process may be performed by using a suitable etching technique such as an ion beam etching (IBE) or a reactive ion etching (RIE).

Figure 1B:
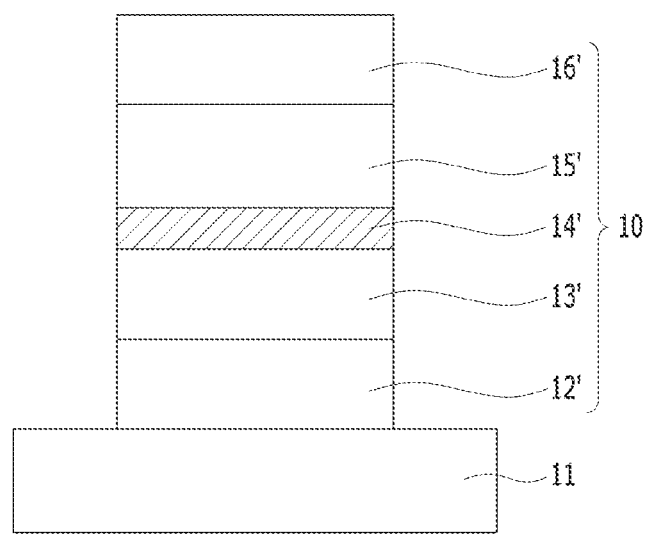

Referring to FIG. 1B, variable resistance element 10 may include an under layer 12', a free layer 13', a tunnel barrier layer 14', a pinned layer 15' and an upper layer 16'. The free layer 13', the tunnel barrier layer 14' and the pinned layer 15' may form an MTJ (Magnetic Tunnel Junction) structure.

Figure 1C:
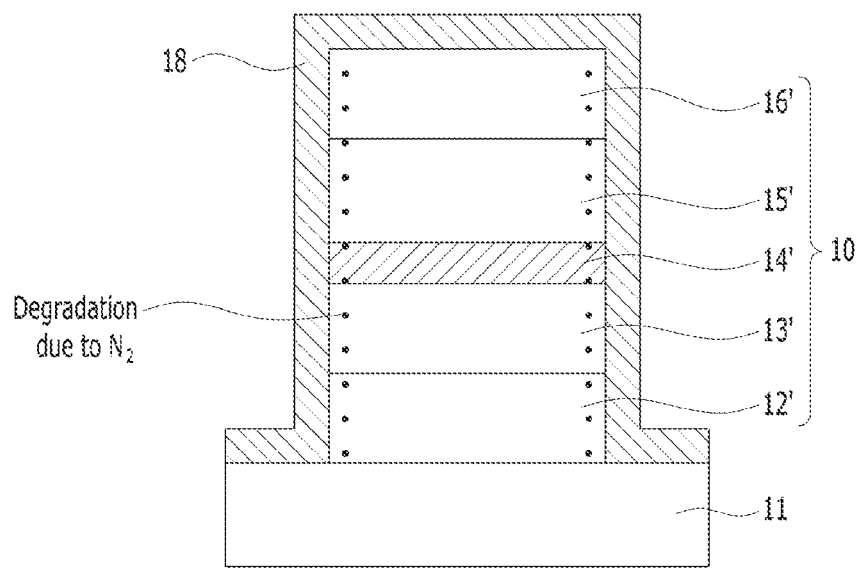

Referring to FIG. 1C, a passivation layer 18 may be formed on sidewalls of the variable resistance element 10 and over the variable resistance element 10, and over a surface of the exposed substrate 11 in order to protect the variable resistance element 10 from subsequence processes.

The passivation layer 18 may be formed by performing a common passivation process and selectively performing a surface cleaning process. The passivation layer 18 may serve to protect the variable resistance element 10 from subsequent processes. The passivation layer 18 may be formed of nitride, an oxide, or a combination thereof. When the passivation layer 18 is formed of a nitride such as $Si_3N_4$, an $N_2$ gas is used as a reaction gas. However, such $N_2$ gas may cause deterioration of the variable resistance element 10. In this regard, some embodiments of the disclosed technology may be implemented to provide a means of protecting the variable resistance element 10 from the reaction gas that can damage the variable resistance element 10 while forming the passivation layer 18.

Then, an interlayer dielectric layer 19 may be deposited over the resultant structure in which the variable resistance element 10 is formed. The deposition may be usually performed by a high-density plasma chemical vapor deposition (HDP-CVD).

The passivation layer 18 formed over the variable resistance element 10 is used to protect the variable resistance element 10 from potential damages caused by subsequent processes such as a vacuum-break and the deposition of the interlayer dielectric layer 19.

However, the passivation layer 18 formed of a nitride layer or an oxide layer is particularly vulnerable to $O_2$, $H_2O$, $N_2$, or other gases, rendering the passivation layer 18 ineffective as a protective layer in subsequent processes such as the deposition of the interlayer dielectric layer 19.

Figure 1D:
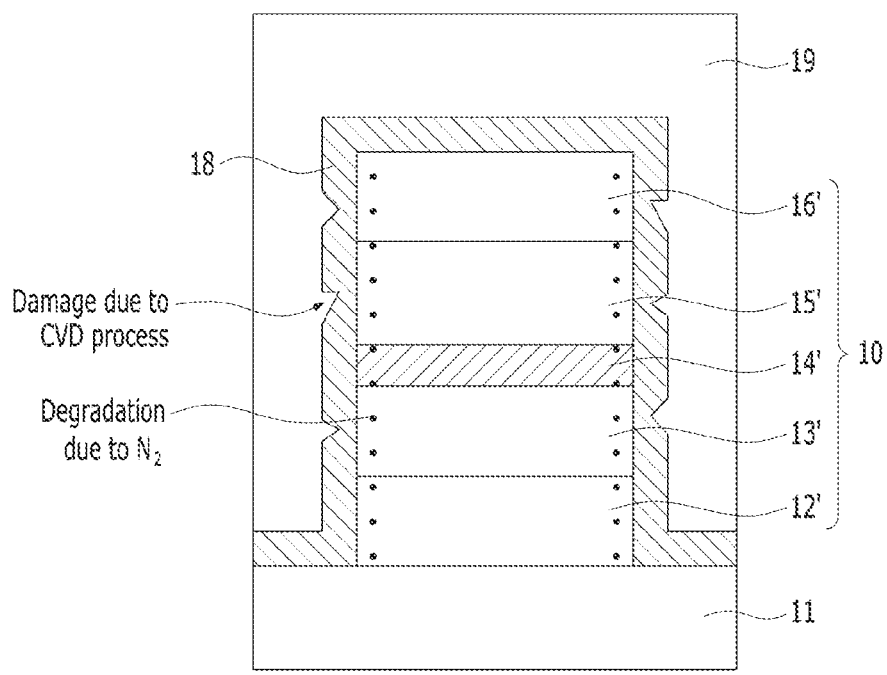

Referring to FIG. 1D, the passivation layer 18 may be damaged by the HDP-CVD process for depositing the interlayer dielectric layer 19, so that it cannot block diffusion of $O_2$, $H_2O$ and $N_2$ from the interlayer dielectric layer 19. This may cause deterioration of performance of the variable resistance element 10.

A variable resistance element has a structure that exhibits different resistance states or values and is capable of being switched between different resistance states in response to an applied bias (e.g., a current or voltage). A resistance state of such a variable resistance element may be changed by applying a voltage or current of a sufficient magnitude (i.e., a threshold) in a data write operation. The different resistance states of different resistance values of the variable resistance element can be used for representing different data for data storage. Thus, the variable resistance element may store different data according to the resistance state. The variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may be implemented to include an MTJ (Magnetic Tunnel Junction) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element.

Some implementations of the disclosed technology relate to providing a semiconductor memory that can efficiently prevent potential damages to the variable resistance element that may occur during the formation of the passivation layer, and can efficiently prevent deterioration of the variable resistance element due to the damages to the passivation layer occurred during the subsequent processes for forming the interlayer dielectric layer.

FIGS. 2A to 2E are cross-sectional views illustrating an example of a semiconductor memory and an example method for fabricating the memory device based on some implementations of the disclosed technology.

Figure 2A:
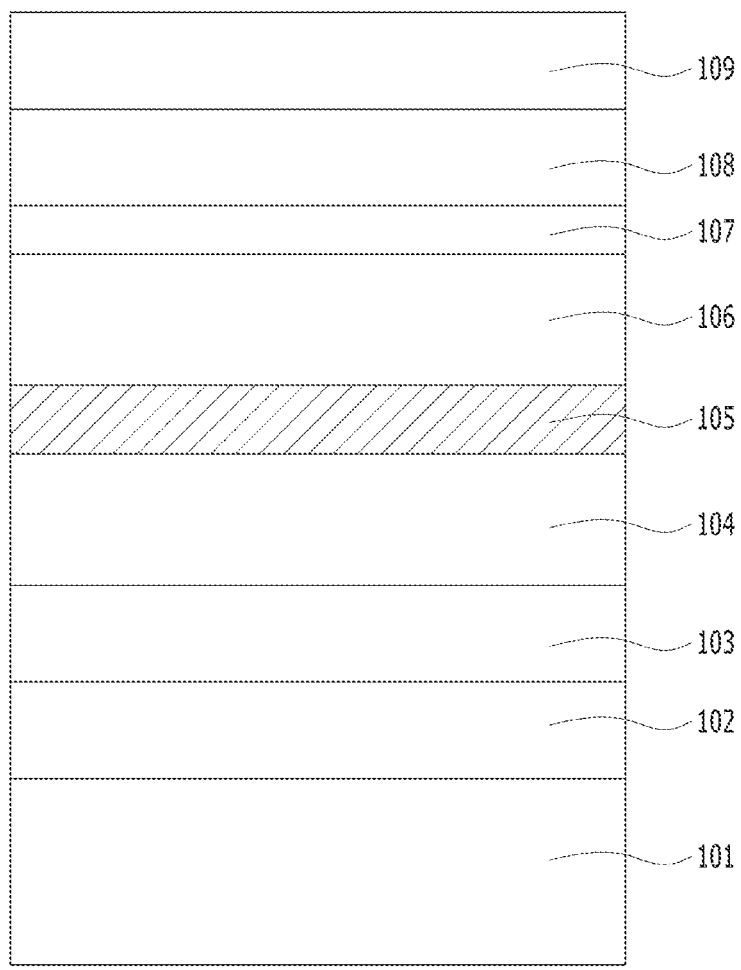
FIGS. 2A to 2E are cross-sectional views illustrating an example of a semiconductor memory and an example method for fabricating the memory device based on some implementations of the disclosed technology.

Referring to FIG. 2A, a substrate 101 where a predetermined structure is formed may be provided. The predetermined structure formed on the substrate 101 may include a switching element (not shown). The switching element may be connected to the variable resistance element (see the reference numeral 100 of FIG. 2E) and serve to control the application of a bias to the variable resistance element 100. The switching element may include one or more transistors, diodes, or a combination of transistors and diodes. The switching element may be electrically connected to the contact plug at a portion of the switching element and to a conductive line, e.g., a source line (not shown), at another portion of the switching element. The substrate 101 may include a semiconductor substrate.

Material layers 102 to 109 for forming the variable resistance element (see the reference numeral 100 of FIG. 2E) may be formed over the substrate 101. In this implementation, The materials layers 102 to 109 may include a material layer 102 for a buffer layer, a material layer 103 for an under layer, a material layer 104 for a free layer, a material layer 105 for a tunnel barrier layer, a material layer 106 for a pinned layer, a material layer 107 for a spacer layer, a material layer 108 for a magnetic correction layer and a material layer 109 for a capping layer, which are sequentially stacked on top of one another.

Figure 2B:
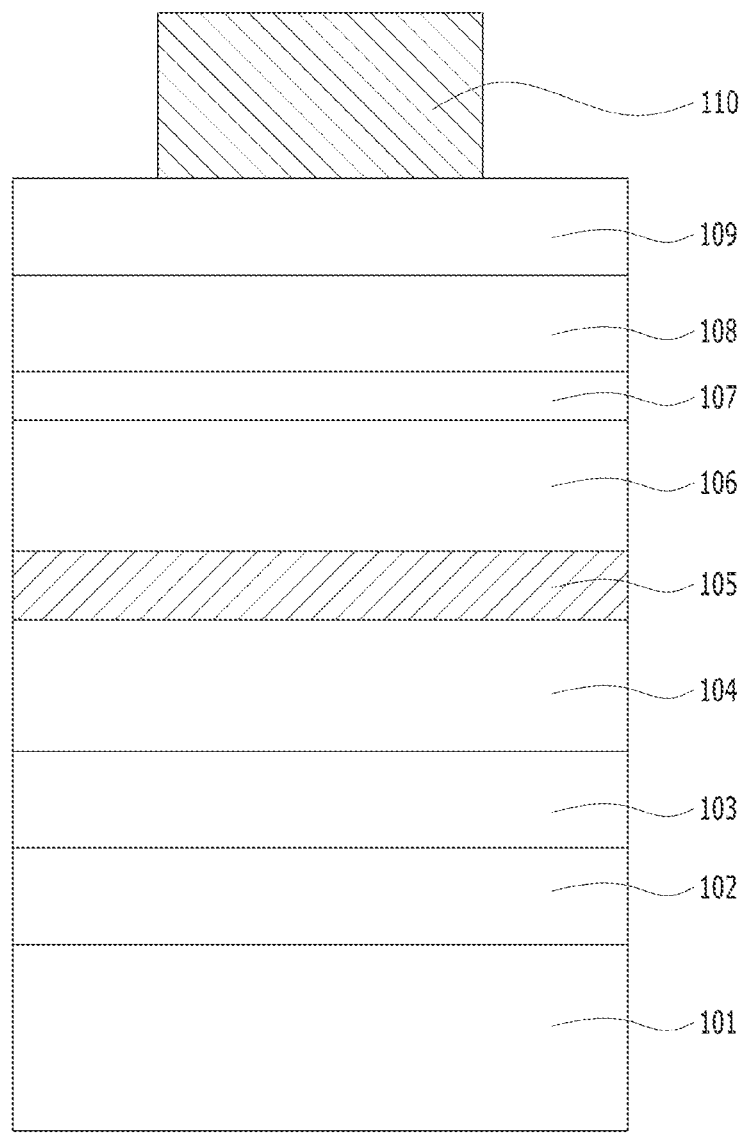

Referring to FIG. 2B, a hard mask pattern 110 may be formed over the material layer 109 for the capping layer.

The hard mask pattern 110 may be formed by patterning a material layer using a photoresist pattern (not shown) over the material layer 109 for the capping layer. For example, the hard mask pattern 110 may be formed by etching the material layer using the photoresist pattern as an etch barrier. This etch process may be performed by ion bean etching (IBE) or reactive ion etching (RIE).

The material layer 109 for the capping layer, the material layer 108 for the magnetic correction layer, the material layer 107 for the spacer layer, the material layer 106 for the pinned layer, the material layer 105 for the tunnel barrier layer, the material layer 104 for the free layer, the material layer 103 for the under layer and the material layer 102 for the buffer layer may be sequentially etched by using the hard mask pattern 110 as an etch barrier. This etch process may be performed by using a suitable etching technique such as an ion beam etching (IBE) or a reactive ion etching (RIE).

Figure 2C:
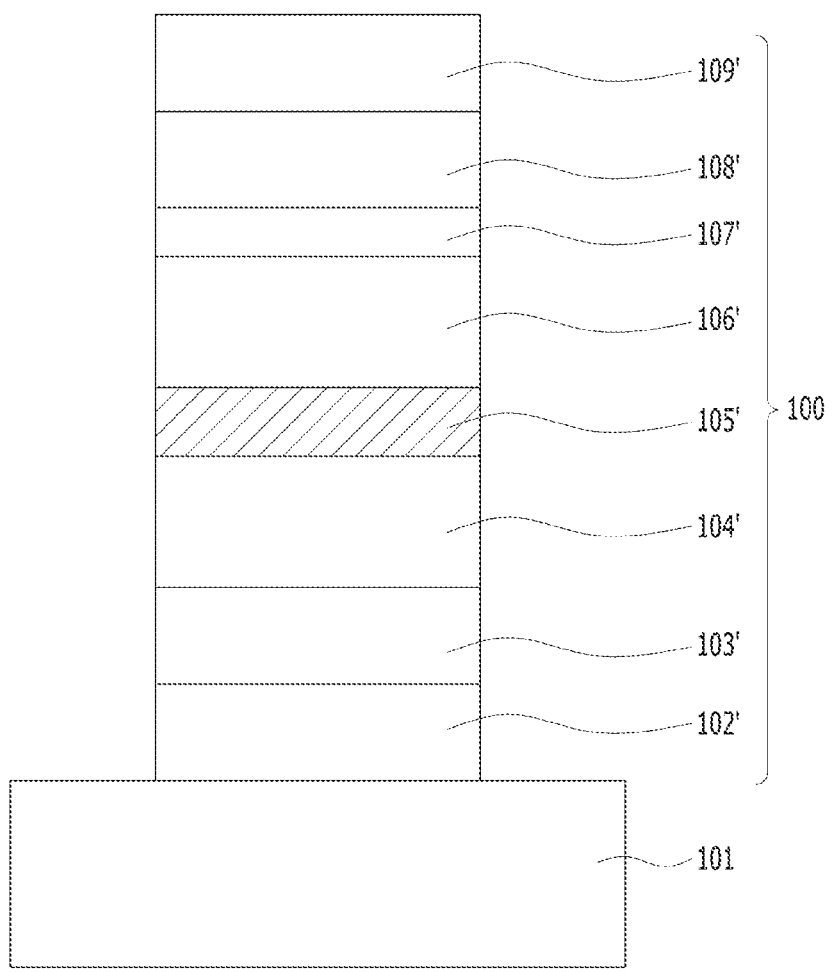

Referring to FIG. 2C, by performing this etch process, a variable resistance element 100 where a buffer layer 102', an under layer 103', a free layer 104', a tunnel barrier layer 105', a pinned layer 106', a spacer layer 107', a magnetic correction layer 108' and a the capping layer 109' are sequentially stacked may be formed over the substrate 101.

The hard mask pattern 110 may be removed during this etch process or by a separate removal process.

In some embodiments of the disclosed technology, a blocking layer, which is implemented to protect material layers that constitute a magnetic tunnel junction structure from potential damages in the subsequent process, is free of oxygen and nitrogen.

Figure 2D:
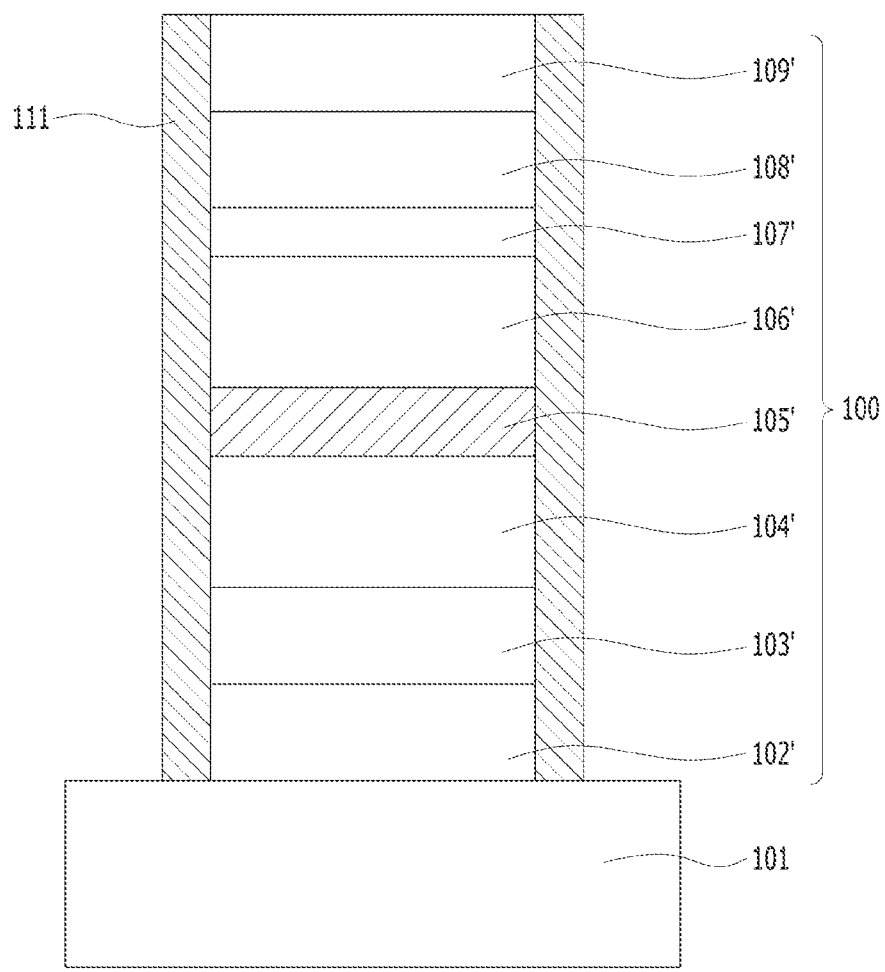

Referring to FIG. 2D, a blocking layer 111 may be formed on sidewalls of the variable resistance element 100 where a buffer layer 102', an under layer 103', a free layer 104', a tunnel barrier layer 105', a pinned layer 106', a spacer layer 107', a magnetic correction layer 108' and a capping layer 109' are sequentially stacked.

Figure 2E:
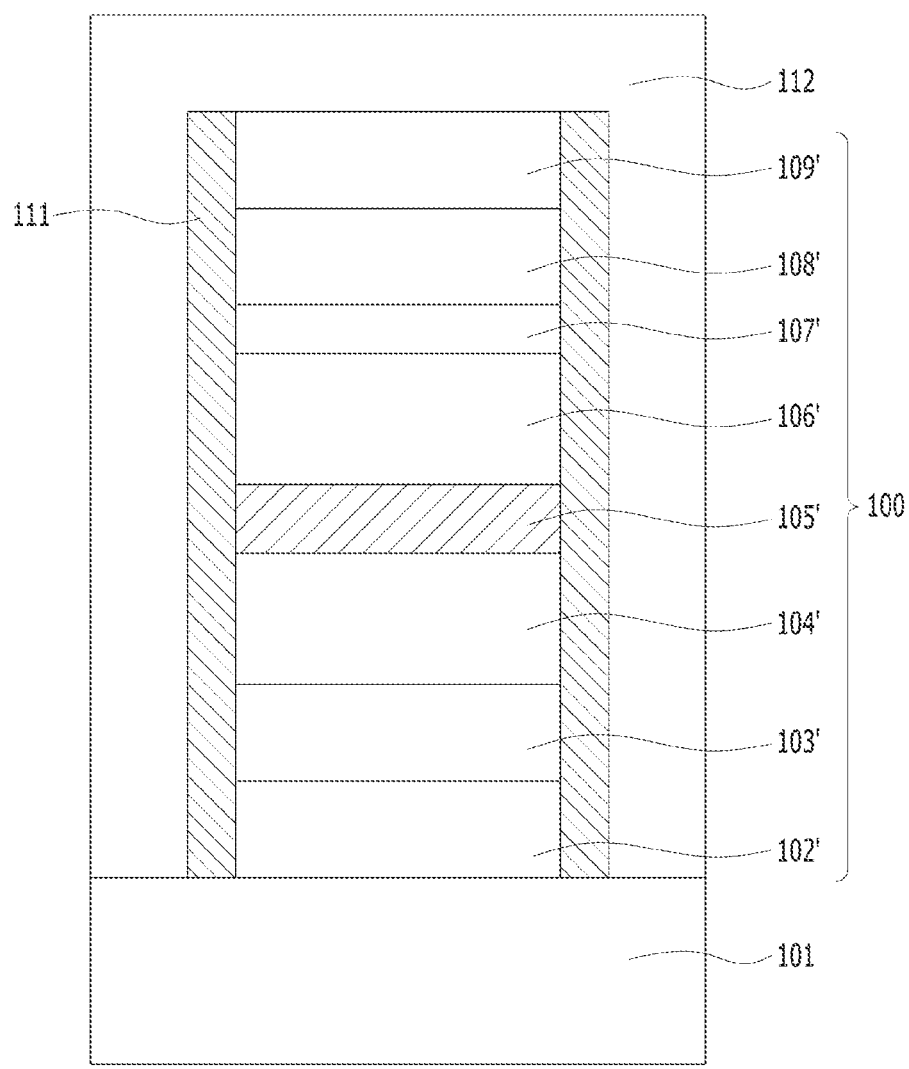

In some embodiments of the disclosed technology, the blocking layer 111 can be implemented to minimize, reduce or prevent the generation of $O_2$, $H_2O$ and $N_2$ to prevent $O_2$, $H_2O$ and $N_2$ from affecting the variable resistance element 100 in subsequent processes such as a process of forming an interlayer dielectric layer (see the reference numeral 112 of FIG. 2E). In this way, material layers that constitute a magnetic tunnel junction structure can be protected, thereby preventing degradation of performance of the variable resistance element 100.

The blocking layer 111 may be substantially free of nitrogen and/or oxygen. In some embodiments of the disclosed technology, the blocking layer 111 may include a nitrogen and/or oxygen free layer.

In one implementation, the blocking layer 111 may be formed by gas soaking to be free of nitrogen and/or oxygen. Gases used for the gas soaking may include silane ($SiH_4$), trisilyl amine (TSA) or a combination thereof.

In another implementation, the blocking layer 111 may be formed by pre-treatment process and deposition process such that the blocking layer 111 is free of nitrogen and/or oxygen. Gases used for the pre-treatment process may include hydrogen ($H_2$), ammonia ($NH_3$) or a combination thereof, and gases for the deposition process may include a combination of silane ($SiH_4$), hydrogen ($H_2$) and argon (Ar), or a combination of trisilyl amine (TSA), hydrogen ($H_2$) and argon (Ar).

Since $N_2$ is not used as a reactant gas for forming the blocking layer 111, it is possible to prevent the variable resistance element 10 from being damaged due to $N_2$ gas used for forming the passivation layer 18 in the variable resistance element 10.

In this implementation, the blocking layer 111 is formed on the sidewalls of the variable resistance element 100. In another implementation, the blocking layer 111 may be formed on the sidewalls of the variable resistance element 100 and over the variable resistance element 100. In further another implementation, the blocking layer 111 may be formed on the sidewalls of the variable resistance element 100 and over the variable resistance element 100, and over a surface of the exposed substrate 101. Referring to FIG. 2E, an interlayer dielectric layer 112 may be formed to cover the resultant structure of FIG. 2D.

The interlayer dielectric layer 112 may be formed by depositing an insulating material and performing a planarization process. The deposition process may be performed by chemical vaporation deposition (CVD) such as high-density plasma chemical vaporation deposition (HDP-CVD).

Since the blocking layer 111 includes a nitrogen-free layer and/or oxygen-free layer (or the blocking layer 111 does not include a substantial amount of nitrogen and/or oxygen), it can more effectively serve as a protective layer in forming the interlayer dielectric layer 112. As such, potential damages to the blocking layer 111 that may be caused during the formation of the interlayer dielectric layer 112 is prevented or minimized, so that the blocking layer 111 can effectively block $O_2$, $H_2O$ and $N_2$ from diffusing from the interlayer dielectric layer 112 to the variable resistance element 100. Therefore, potential damages to the variable resistance element 100 caused by diffusion of $O_2$, $H_2O$ and $N_2$ can be prevented or minimized, thereby improving the performance of the variable resistance element 100.

The semiconductor memory of FIG. 2E may be formed by the processes explained as above.

Referring to FIG. 2E, the semiconductor memory based on some implementations of the disclosed technology may include the variable resistance element 100 disposed over the substrate 101, the blocking layer 111 disposed on the sidewalls of the variable resistance element 100 and the interlayer dielectric layer 112 covering the variable resistance element 100, the blocking layer 111 and the exposed substrate 101.

A variable resistance element 100 based on some implementations of the disclosed technology may include an MTJ structure including a free layer 104' having a variable magnetization direction, a pinned layer 106' having a fixed magnetization direction, and a tunnel barrier layer 105' interposed between the free layer 104' and the pinned layer 106'.

The free layer 104' may have one of different magnetization directions or one of different spin directions of electrons to switch the polarity of the free layer 104' in the MTJ structure, resulting in changes in resistance value. In some implementations, the polarity of the free layer 104' is changed (or flipped) upon application of a voltage or current signal (e.g., a driving current above a certain threshold) to the MTJ structure. With the polarity changes of the free layer 104', the free layer 104' and the pinned layer 106' have different magnetization directions or different spin directions of electron, which allows the variable resistance element 100 to store different data or represent different data bits. The free layer 104' may also be referred as a storage layer. The magnetization direction of the free layer 104' may be substantially perpendicular to a surface of the free layer 104', the tunnel barrier layer 105' and the pinned layer 106'. In other words, the magnetization direction of the free layer 104' may be substantially parallel to stacking directions of the free layer 104', the tunnel barrier layer 105' and the pinned layer 106'. Therefore, the magnetization direction of the free layer 104' may be changed between a downward direction and an upward direction. The change in the magnetization direction of the free layer 104' may be induced by a spin transfer torque generated by an applied current or voltage.

The free layer 104' may have a single-layer or multilayer structure including a ferromagnetic material. For example, the free layer 104' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 105' may allow the tunneling of electrons in both data reading and data writing operations. In a write operation for storing new data, a high write current may be directed through the tunnel barrier layer 105' to change the magnetization direction of the free layer 104' and thus to change the resistance state of the MTJ for writing a new data bit. In a reading operation, a low reading current may be directed through the tunnel barrier layer 105' without changing the magnetization direction of the free layer 104' to measure the existing resistance state of the MTJ under the existing magnetization direction of the free layer 104' to read the stored data bit in the MTJ. The tunnel barrier layer 105' may include a dielectric oxide such as MgO, CaO, SrO, TiO, VO, or NbO or others.

The pinned layer 106' may have a pinned magnetization direction, which remains unchanged while the magnetization direction of the free layer 104' changes. The pinned layer 106' may be referred to as a reference layer. In some implementations, the magnetization direction of the pinned layer 106' may be pinned in a downward direction. In some implementations, the magnetization direction of the pinned layer 106' may be pinned in an upward direction.

The pinned layer 106' may have a single-layer or multilayer structure including a ferromagnetic material. For example, the pinned layer 106' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or may include a stack of metal layers, such as Co/Pt, or Co/Pd or others.

If a voltage or current is applied to the variable resistance element 100, the magnetization direction of the free layer 104' may be changed by spin torque transfer. In some implementations, when the magnetization directions of the free layer 104' and the pinned layer 106' are parallel to each other, the variable resistance element 100 may be in a low resistance state, and this may indicate a digital data bit "0". Conversely, when the magnetization directions of the free layer 104' and the pinned layer 106' are anti-parallel to each other, the variable resistance element 100 may be in a high resistance state, and this may indicate a digital data bit "1". In some implementations, the variable resistance element 100 can be configured to store data bit '1' when the magnetization directions of the free layer 104' and the pinned layer 106' are parallel to each other and to store data bit '0' when the magnetization directions of the free layer 104' and the pinned layer 106' are anti-parallel to each other.

In some implementations, the variable resistance element 100 may further include one or more layers performing various functions to improve a characteristic of the MTJ structure. For example, the variable resistance element 100 may further include at least one of a buffer layer 102', an under layer 103', a spacer layer 107', a magnetic correction layer 108' and a capping layer 109'.

The under layer 103' may be disposed under the free layer 104' and serve to improve perpendicular magnetic crystalline anisotropy of the free layer 104'. The under layer 103' may have a single-layer or multilayer structure including a metal, a metal alloy, a metal nitride, or a metal oxide, or a combination thereof.

The buffer layer 102' may be disposed below the under layer 103' to facilitate crystal growth of the under layer 103', thus improving perpendicular magnetic crystalline anisotropy of the free layer 104'. The buffer layer 102' may have a single-layer or multilayer structure including a metal, a metal alloy, a metal nitride, or a metal oxide, or a combination thereof. Moreover, the buffer layer 102' may be formed of or include a material having a good compatibility with a bottom electrode (not shown) in order to resolve the lattice constant mismatch between the bottom electrode and the under layer 103'. For example, the buffer layer 102' may include tantalum (Ta).

The capping layer 109' may function as a hard mask for patterning the variable resistance element 100. In some implementations, the capping layer 109' may include various conductive materials such as a metal. In some implementations, the capping layer 109' may include a metallic material having almost none or a small number of pin holes and high resistance to wet and/or dry etching. In some implementations, the capping layer 109' may include a metal, a nitride or an oxide, or a combination thereof. For example, the capping layer 109' may include a noble metal such as ruthenium (Ru).

The magnetic correction layer 108' may serve to offset the effect of the stray magnetic field produced by the pinned layer 106'. In this case, the effect of the stray magnetic field of the pinned layer 106' can decrease, and thus a biased magnetic field in the free layer 104' can decrease. The magnetic correction layer 108' may have a magnetization direction anti-parallel to the magnetization direction of the pinned layer 106'. In the implementation, when the pinned layer 106' has a downward magnetization direction, the magnetic correction layer 108' may have an upward magnetization direction. Conversely, when the pinned layer 106' has an upward magnetization direction, the magnetic correction layer 108' may have a downward magnetization direction. The magnetic correction layer 108' may have a single-layer or multilayer structure including a ferromagnetic material.

In this implementation, the magnetic correction layer 108' is located above the pinned layer 106', but the magnetic correction layer 108' may be disposed at a different location. For example, the magnetic correction layer 108' may be located above, below, or next to the MTJ structure while the magnetic correction layer 108' is patterned separately from the MTJ structure.

A material layer (not shown) for resolving the lattice structure differences and the lattice constant mismatch between the pinned layer 106' and the magnetic correction layer 108' may be interposed between the pinned layer 106' and the magnetic correction layer 108'. For example, this material layer may be amorphous and may include a metal a metal nitride, or metal oxide.

The spacer layer 107' may be interposed between the magnetic correction layer 108' and the pinned layer 106' and function as a buffer between the magnetic correction layer 108' and the pinned layer 106'. The spacer layer 107' may serve to improve characteristics of the magnetic correction layer 108'. The spacer layer 107' may include a noble metal such as ruthenium (Ru).

The blocking layer 111 formed on the sidewalls of the variable resistance element 100 may be formed of a material that does not substantially include nitrogen and/or oxygen. For example, the blocking layer 111 may include a nitrogen-free layer and/or an oxygen-free layer. Since a reaction gas that can damage the variable resistance element 100, such as $N_2$, is not used for forming the blocking layer 111, it is possible to prevent deterioration of the variable resistance element 100 caused by $N_2$ during the formation of the blocking layer 111. In addition, the blocking layer 111 blocks the deterioration factors such as $O_2$, $H_2O$ and $N_2$ diffused to the variable resistance element 100 in a subsequent process, thereby protecting the variable resistance element 100 from the diffused $O_2$, $H_2O$ and $N_2$.

Therefore, the semiconductor memory and its fabrication method based on some embodiments of the disclosed technology can make it possible to improve the performance of the variable resistance element 100.

In this implementation, the blocking layer 111 is formed on the sidewalls of the variable resistance element 100. In another implementation, the blocking layer 111 may be formed on the sidewalls of the variable resistance element 100 and over the variable resistance element 100. In further another implementation, the blocking layer 111 may be formed on the sidewalls of the variable resistance element 100 and over the variable resistance element 100, and over a surface of the exposed substrate 101.

FIGS. 3A to 3F are cross-sectional views illustrating another example of the semiconductor memory and its fabrication method based on some implementations of the disclosed technology. The following descriptions will be focused on a difference from the implementation of FIGS. 2A to 2E.

Figure 3A:
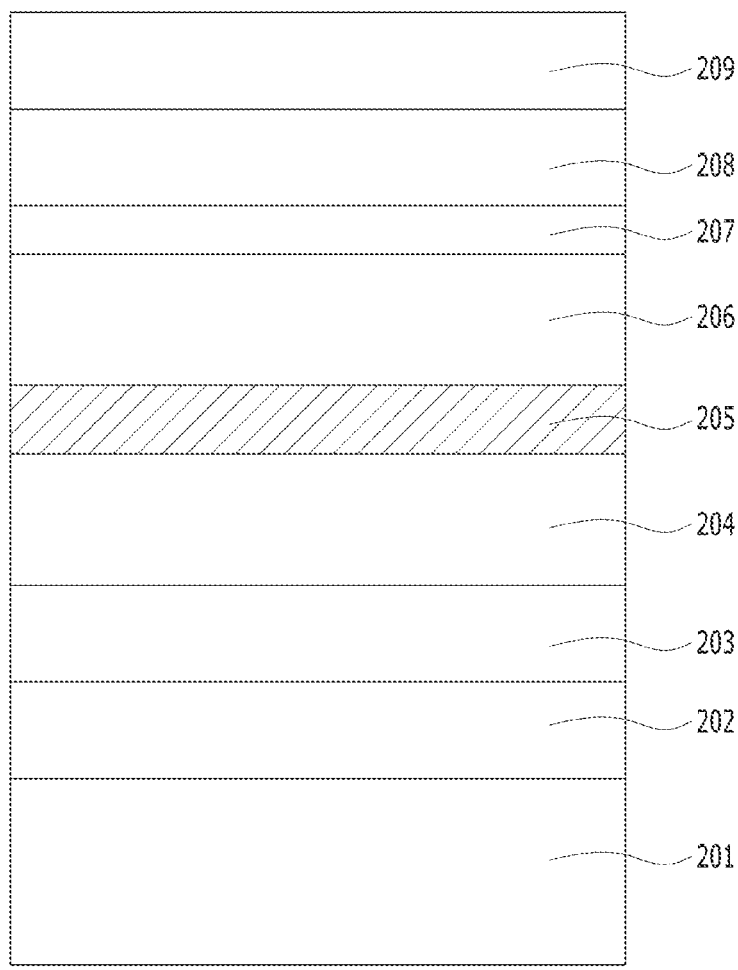
FIGS. 3A to 3F are cross-sectional views illustrating another example of the semiconductor memory and a method for fabricating the memory device based on some implementations of the disclosed technology.

Referring to FIG. 3A, a substrate 201 where a predetermined structure is formed may be provided. The predetermined structure formed on the substrate 201 may include a switching element (not shown). The switching element may be connected to the variable resistance element (see the reference numeral 200 of FIG. 3F) and serve to control the application of a bias to the variable resistance element 200. The switching element may include one or more transistors or diodes. The switching element may be electrically connected to the contact plug at a portion of the switching element and to a conductive line, e.g., a source line (not shown), at another portion of the switching element. The substrate 201 may include a semiconductor substrate.

Material layers 202 to 209 for forming the variable resistance element (see the reference numeral 200 of FIG. 3F) may be formed over the substrate 201. In this implementation, The materials layers 202 to 209 may include a material layer 202 for a buffer layer, a material layer 203 for an under layer, a material layer 204 for a free layer, a material layer for a tunnel barrier layer, a material layer 206 for a pinned layer, a material layer 207 for a spacer layer, a material layer 208 for a magnetic correction layer and a material layer 209 for a capping layer, which are sequentially stacked on top of one another.

Figure 3B:
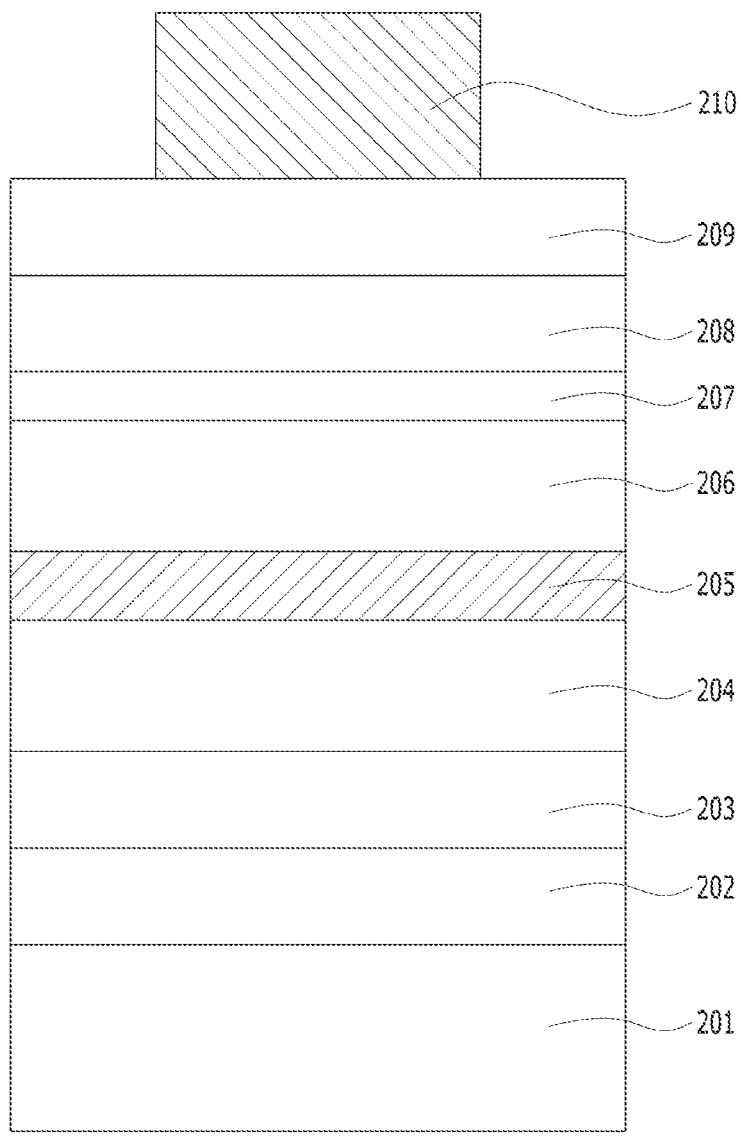

Referring to FIG. 3B, a hard mask pattern 210 may be formed over the material layer 209 for the capping layer.

The hard mask pattern 210 may be formed by patterning a material layer using a photoresist pattern (not shown) over the material layer 209 for the capping layer. For example, the hard mask pattern 210 may be formed by etching the material layer using the photoresist pattern as an etch barrier.

The material layer 209 for the capping layer, the material layer 208 for the magnetic correction layer, the material layer 207 for the spacer layer, the material layer 206 for the pinned layer, the material layer 205 for the tunnel barrier layer, the material layer 204 for the free layer, the material layer 203 for the under layer and the material layer 202 for the buffer layer may be sequentially etched by using the hard mask pattern 210 as an etch barrier. This etch process may be performed by ion bean etching (IBE) or reactive ion etching (RIE).

Figure 3C:
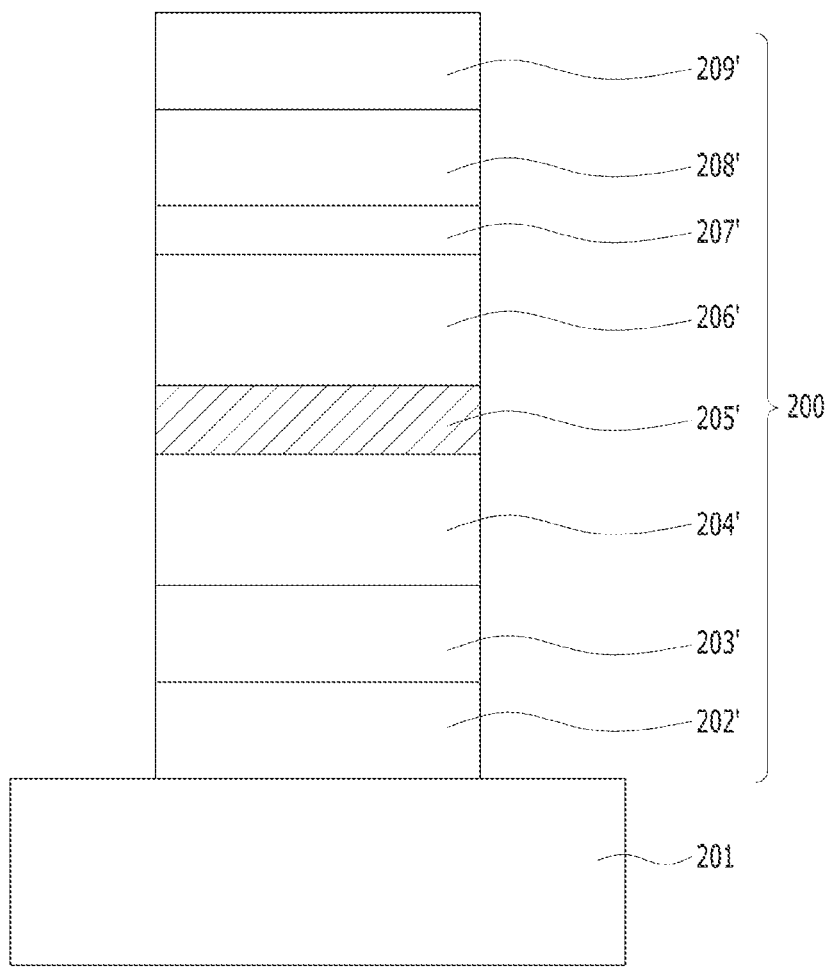

Referring to FIG. 3C, by performing this etch process, a variable resistance element 200 where a buffer layer 202', an under layer 203', a free layer 204', a tunnel barrier layer 205', a pinned layer 206', a spacer layer 207', a magnetic correction layer 208' and a capping layer 209' are sequentially stacked may be formed over the substrate 201.

The hard mask pattern 210 may be removed during this etch process or by a separate removal process.

In some embodiments of the disclosed technology, a blocking layer, which is implemented to protect material layers that constitute a magnetic tunnel junction structure from potential damages in the subsequent process, is free of oxygen and nitrogen.

Figure 3D:
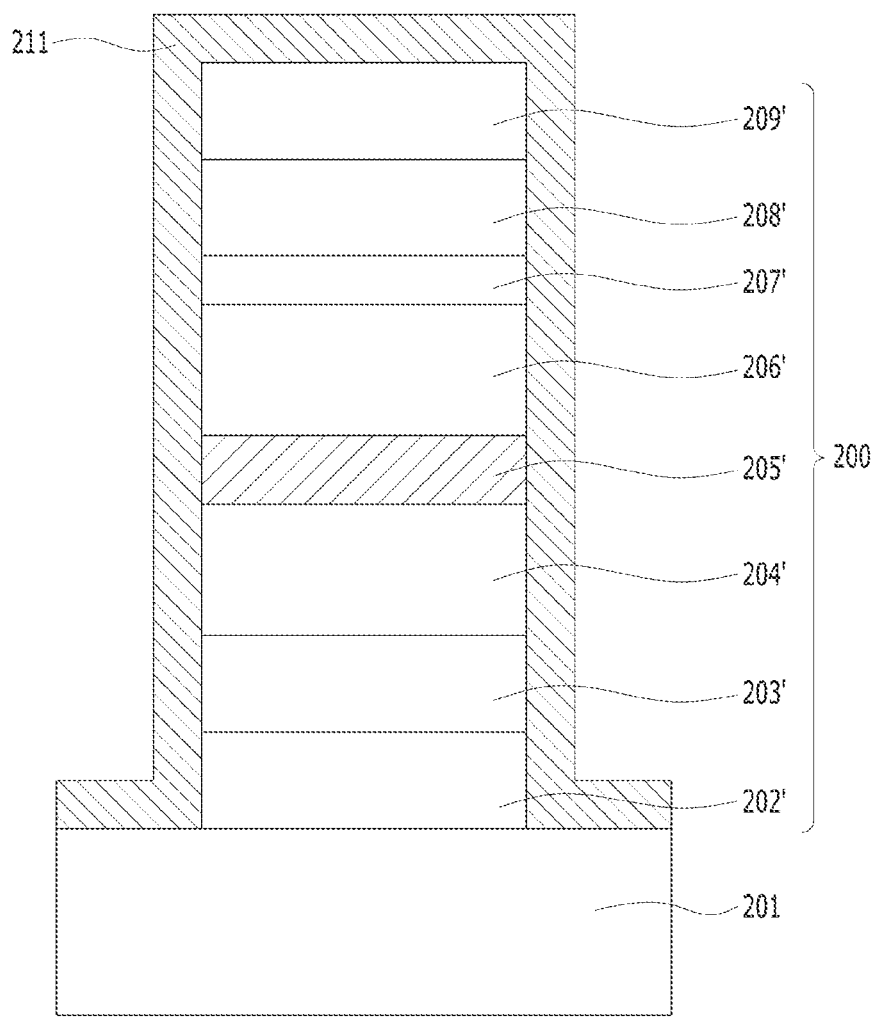

Referring to FIG. 3D, a blocking layer 211 may be formed on sidewalls of the variable resistance element 200 where a buffer layer 202', an under layer 203', a free layer 204', a tunnel barrier layer 205', a pinned layer 206', a spacer layer 207', a magnetic correction layer 208' and a capping layer 209' are sequentially stacked and over the variable resistance element 200, and over a surface of the exposed substrate 201. That is, the blocking layer 211 may be formed to cover the variable resistance element 200 and the exposed substrate 201.

Figure 3E:
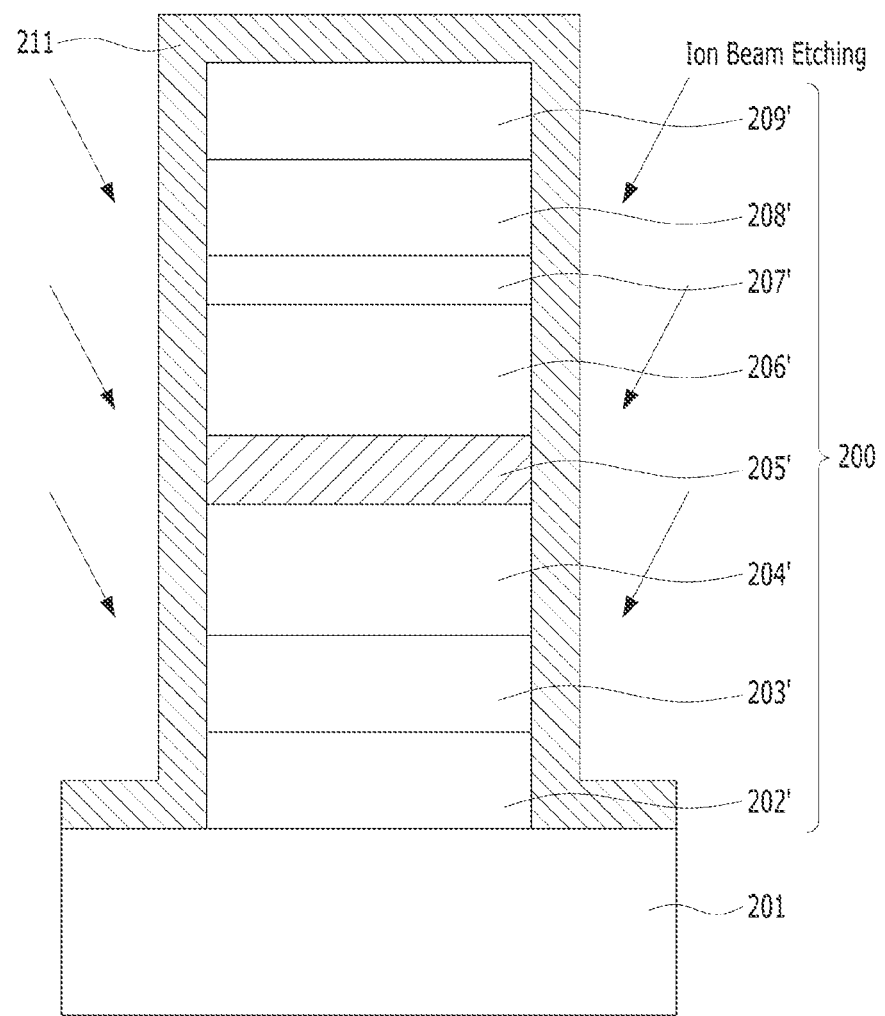
Figure 3F:
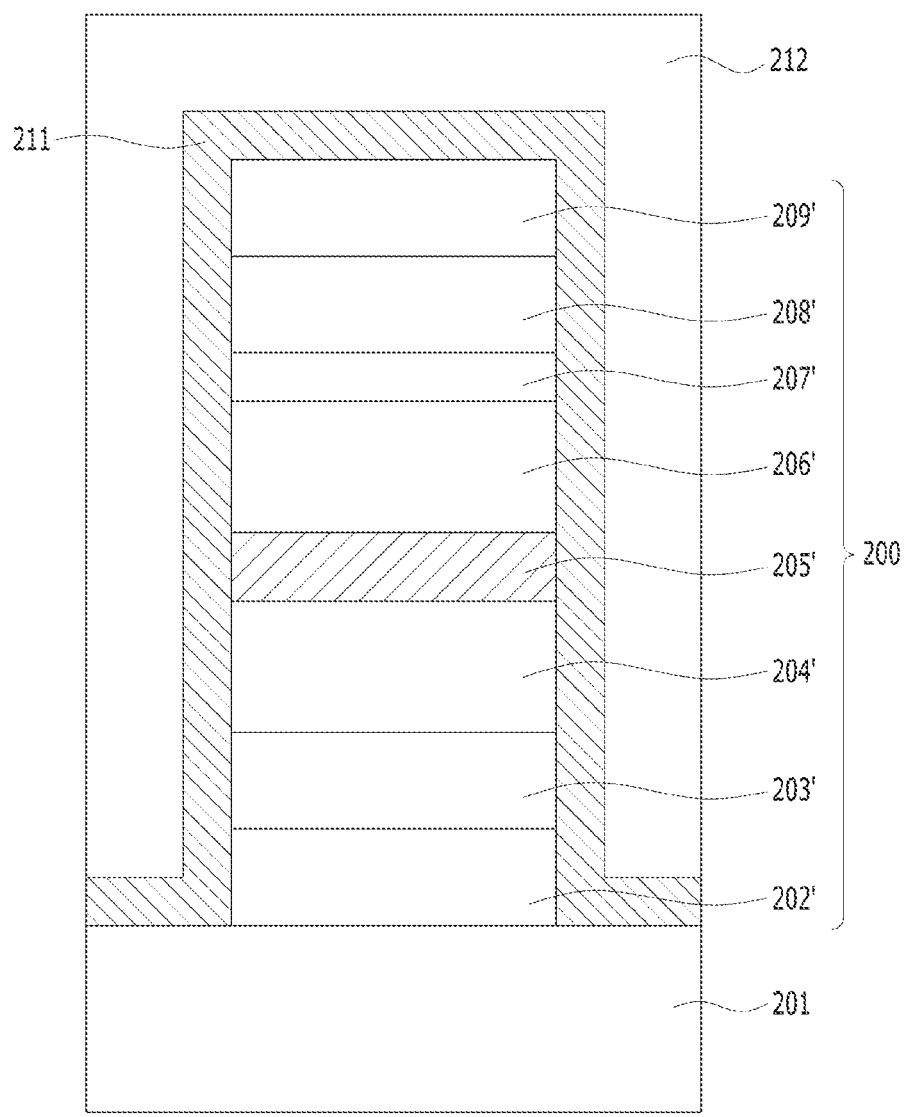

In some embodiments of the disclosed technology, the blocking layer 211 can be implemented to minimize, reduce or prevent the generation of $O_2$, $H_2O$ and $N_2$ to prevent $O_2$, $H_2O$ and $N_2$ from affecting the variable resistance element 200 in subsequent processes such as a process of forming an interlayer dielectric layer (see the reference numeral 212 of FIG. 3F). In this way, material layers that constitute a magnetic tunnel junction structure can be protected, thereby preventing degradation of performance of the variable resistance element 200.

The blocking layer 211 may be substantially free of nitrogen and/or oxygen. In some embodiments of the disclosed technology, the blocking layer 211 may include a nitrogen and/or oxygen free layer.

In one implementation, the blocking layer 211 may be formed by gas soaking to be free of nitrogen and/or oxygen. Gases used for the gas soaking may include silane ($SiH_4$), trisilyl amine (TSA) or a combination thereof. In another implementation, the blocking layer 211 may be formed by pre-treatment process and deposition process such that the blocking layer 211 is free of nitrogen and/or oxygen. Gases used for the pre-treatment process may include hydrogen ($H_2$), ammonia ($NH_3$) or a combination thereof, and gases for the deposition process may include a combination of silane ($SiH_4$), hydrogen ($H_2$) and argon (Ar), or a combination of trisilyl amine (TSA), hydrogen ($H_2$) and argon (Ar).

Since $N_2$ is not used as a reactant gas for forming the blocking layer 211, it is possible to prevent the variable resistance element 10 from being damaged due to $N_2$ gas used for forming the passivation layer 18 in the variable resistance element 10.

In this implementation, the blocking layer 211 is formed on the sidewalls of the variable resistance element 200 and over the variable resistance element 200, and over a surface of the exposed substrate 201. In another implementation, the blocking layer 211 may be formed on the sidewalls of the variable resistance element 200. In further another implementation, the blocking layer 211 may be formed on the sidewalls of the variable resistance element 200 and over the variable resistance element 200.

Referring to FIG. 3E, an ion bean etching process may be performed on the resultant structure of FIG. 3D. The ion beam etching process may serve to isolate devices and prevent the blocking layer 211 from being vulnerable to leakage. That is, by performing the ion beam etching process on the variable resistance element 200 where the blocking layer 211 is formed, it is possible to prevent a leakage problem.

Referring to FIG. 3F, an interlayer dielectric layer 212 may be formed to cover the resultant structure of FIG. 3E.

The interlayer dielectric layer 212 may be formed by depositing an insulating material and performing a planarization process. The deposition process may be performed by chemical vaporation deposition (CVD), for example, high-density plasma chemical vaporation deposition (HDP-CVD).

Since the blocking layer 211 includes a nitrogen-free layer and/or oxygen-free layer (or the blocking layer 211 does not include a substantial amount of nitrogen and/or oxygen), it can more effectively serve as a protective layer in forming the interlayer dielectric layer 212. As such, potential damages to the blocking layer 211 that may be caused during the formation of the interlayer dielectric layer 212 is prevented or minimized, so that the blocking layer 211 can effectively block $O_2$, $H_2O$ and $N_2$ from diffusing from the interlayer dielectric layer 212 to the variable resistance element 200.

Therefore, potential damages to the variable resistance element 100 caused by diffusion of $O_2$, $H_2O$ and $N_2$ can be prevented or minimized, thereby improving the performance of the variable resistance element 200.

The semiconductor memory of FIG. 3F may be formed by the processes explained as above.

Referring to FIG. 3F, the semiconductor memory based on some implementations of the disclosed technology may include the variable resistance element 200 disposed over the substrate 201, the blocking layer 211 disposed on the sidewalls of the variable resistance element 200 and over the variable resistance element 200, and over a surface of the exposed substrate 201 and the dielectric layer 212 covering the variable resistance element 200 and the blocking layer 211.

A variable resistance element 200 based on some implementations of the disclosed technology may include an MTJ structure including a free layer 204' having a variable magnetization direction, a pinned layer 206' having a fixed magnetization direction, and a tunnel barrier layer 205' interposed between the free layer 204' and the pinned layer 206'.

In some implementations, the variable resistance element 200 may further include one or more layers performing various functions to improve a characteristic of the MTJ structure. For example, the variable resistance element 200 may further include at least one of a buffer layer 202', an under layer 203', a spacer layer 207', a magnetic correction layer 208' and a capping layer 209'.

The blocking layer 211 formed on the sidewalls of the variable resistance element 200 and over variable resistance element 200 may be formed of a material that does not substantially include nitrogen and/or oxygen. For example, the blocking layer 211 may include a nitrogen-free layer and/or an oxygen-free layer. Since a reaction gas that can damage the variable resistance element 200, such as $N_2$, is not used for forming the blocking layer 211, it is possible to prevent deterioration of the variable resistance element 200 caused by $N_2$ during the formation of the blocking layer 211. In addition, the blocking layer 211 blocks the deterioration factors such as $O_2$, $H_2O$ and $N_2$ diffused to the variable resistance element 200 in a subsequent process, thereby protecting the variable resistance element 200 from the diffused $O_2$, $H_2O$ and $N_2$. Moreover, in this implementation, by performing the ion beam etching process after forming the blocking layer 211, a problem that the blocking layer 211 may be vulnerable to leakage can be overcome.

Therefore, the semiconductor memory and its fabrication method can make it possible to secure stable performance of the variable resistance element 200.

Figure 4:
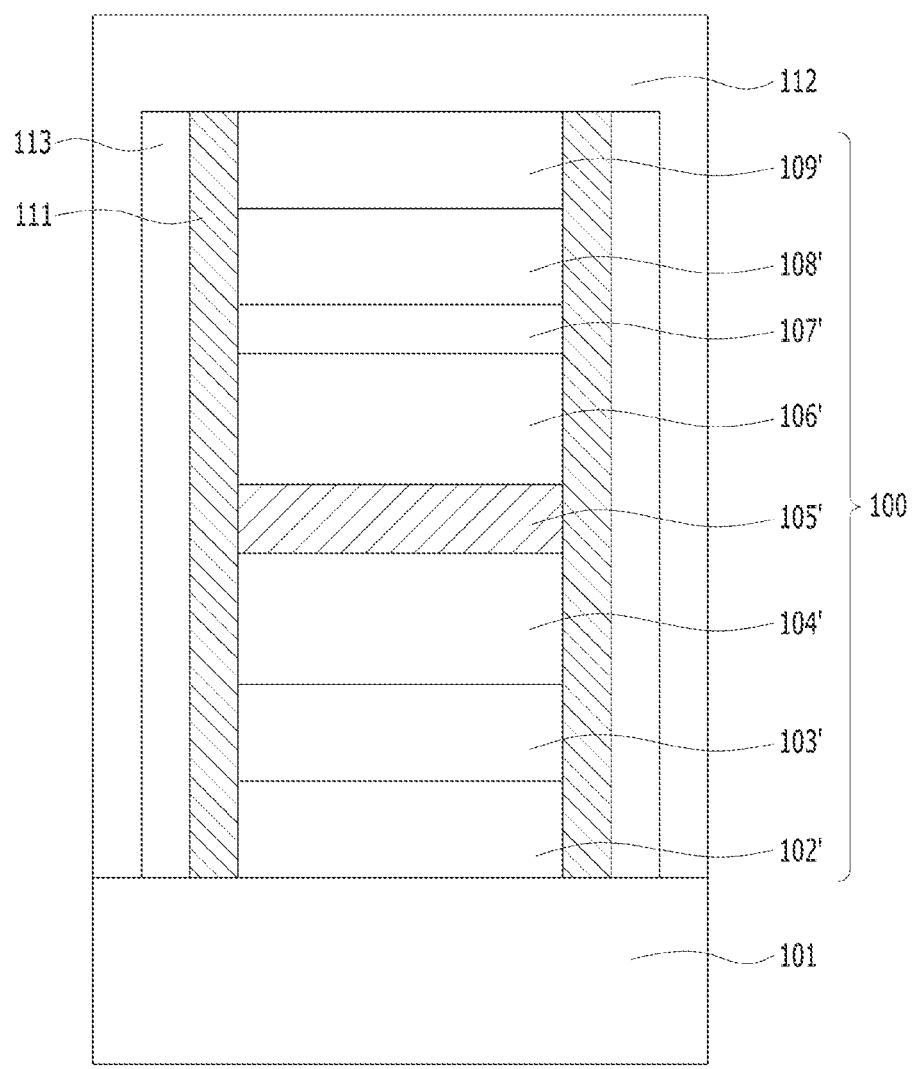
FIG. 4 is a cross-sectional view illustrating another example of the semiconductor memory based on some implementations of the disclosed technology.

FIG. 4 is a cross-sectional view illustrating another example of the semiconductor memory and its fabrication method based on some implementations of the disclosed technology. The following descriptions will be focused on a difference from the implementation of FIGS. 2A to 2E.

The semiconductor memory and its fabrication method shown in FIG. 4 is similar to the semiconductor memory and its fabrication method shown in FIGS. 2A to 2E except for further including a protective layer 113 formed on sidewalls of the blocking layer 111.

The protective layer 113 may be formed of a nitride layer, an oxide layer, or a combination thereof and may serve to further protect the variable resistance element 100.

In an implementation, the blocking layer 111 which may not substantially contain nitrogen and/or oxygen, preferably include nitrogen and/or oxygen free layer is interposed between the protective layer 113 and the variable resistance element 100. Therefore, although gases such as N₂ and the like is used for forming the protective layer 113, the blocking layer 112 can block gases such as N₂ and the like. As a result, it is possible to prevent deterioration of the variable resistance element 100 caused by gases such as N₂. Further, although the protective layer 113 is damaged by CVD, for example HDP-CVD during forming the interlayer dielectric layer 112 in a subsequent process, the blocking layer 112 can serve as a protective layer to prevent deterioration of the variable resistance element 100.

Therefore, in an implementation, it is possible to more effectively prevent degradation of the variable resistance element 100 by a dual structure of the blocking layer 112 and the protective layer 113 and secure a stable performance of the variable resistance element 100.

Figure 5:
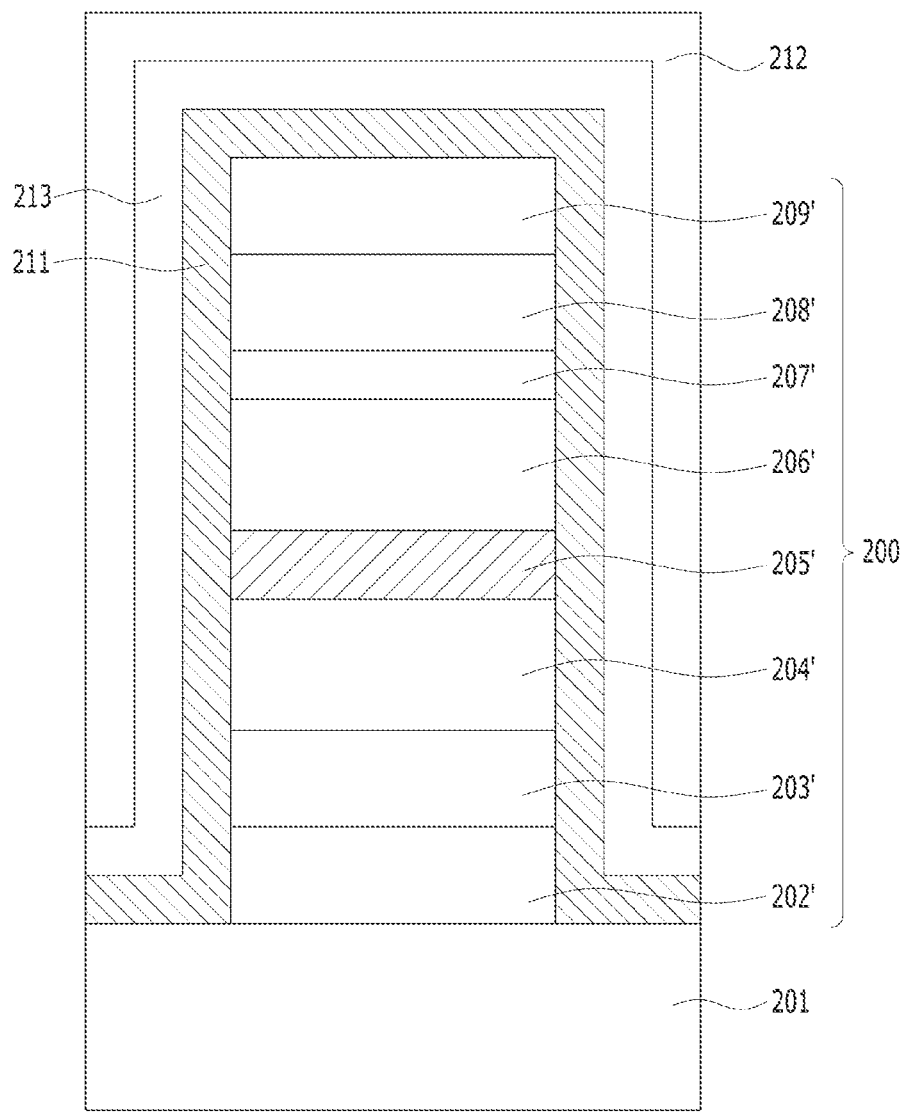
FIG. 5 is a cross-sectional view illustrating another example of the semiconductor memory based on some implementations of the disclosed technology.

FIG. 5 is a cross-sectional view illustrating another example of the semiconductor memory and its fabrication process based on some implementations of the disclosed technology. The following descriptions will be focused on a difference from the implementation of FIGS. 3A to 3F.

The semiconductor memory and its fabrication method shown in FIG. 5 is similar to the semiconductor memory and its fabrication method shown in FIGS. 3A to 3F except for further including a protective layer 213 surrounding the blocking layer 211.

The protective layer 213 may be formed of a nitride layer, an oxide layer, or a combination thereof and may serve to further protect the variable resistance element 200.

In an implementation, the blocking layer 211 which may not substantially contain nitrogen and/or oxygen, preferably include nitrogen and/or oxygen free layer is interposed between the protective layer 213 and the variable resistance element 200. Therefore, although gases such as N₂ and the like is used for forming the protective layer 213, the blocking layer 211 can block gases such as N₂ and the like. As a result, it is possible to prevent deterioration of the variable resistance element 100 caused by gases such as N₂. Further, although the protective layer 213 is damaged by CVD, for example HDP-CVD during forming the interlayer dielectric layer 212 in a subsequent process, the blocking layer 211 can serve as a protective layer to prevent deterioration of the variable resistance element 200.

Therefore, in an implementation, it is possible to more effectively prevent degradation of the variable resistance element 200 by a dual structure of the blocking layer 212 and the protective layer 213 and secure a stable performance of the variable resistance element 200.

In the implementations shown in FIGS. 2A to 2E, FIGS. 3A to 3F, FIG. 4 and FIG. 5, the free layer 104'/204' is formed below the pinned layer 106'/206'. In another implementation, the free layer 104'/204' may be formed over the pinned layer 106'/206'.

Figure 6:
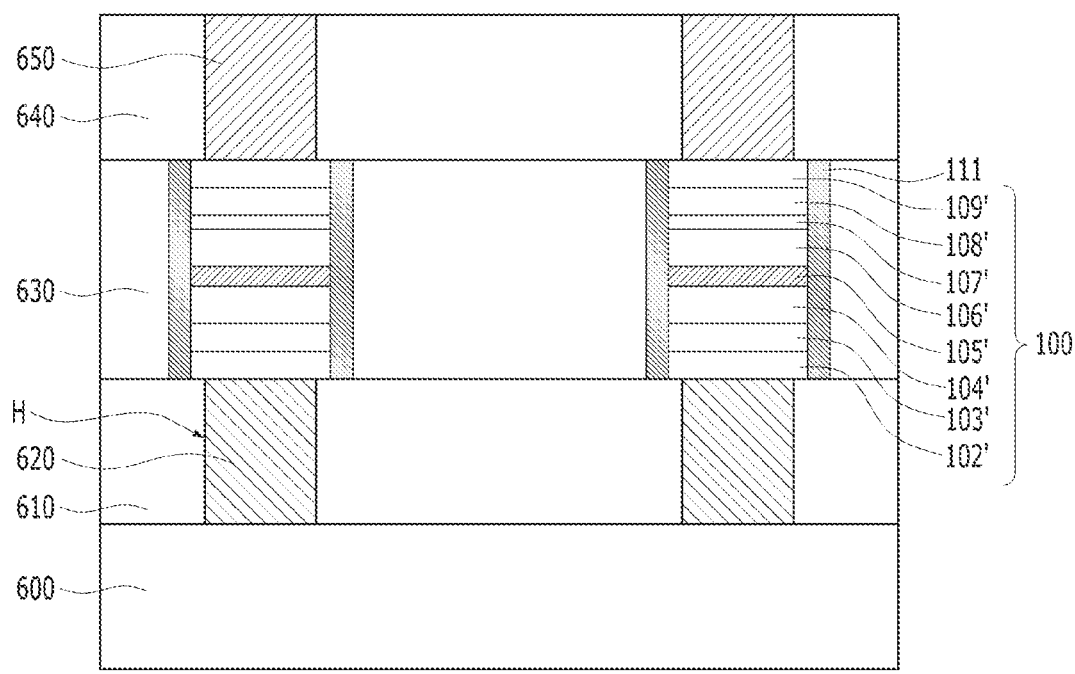
FIG. 6 is a cross-sectional view illustrating an example of a memory device and an example method for fabricating the memory device based on some implementations of the disclosed technology.
Figure 7:
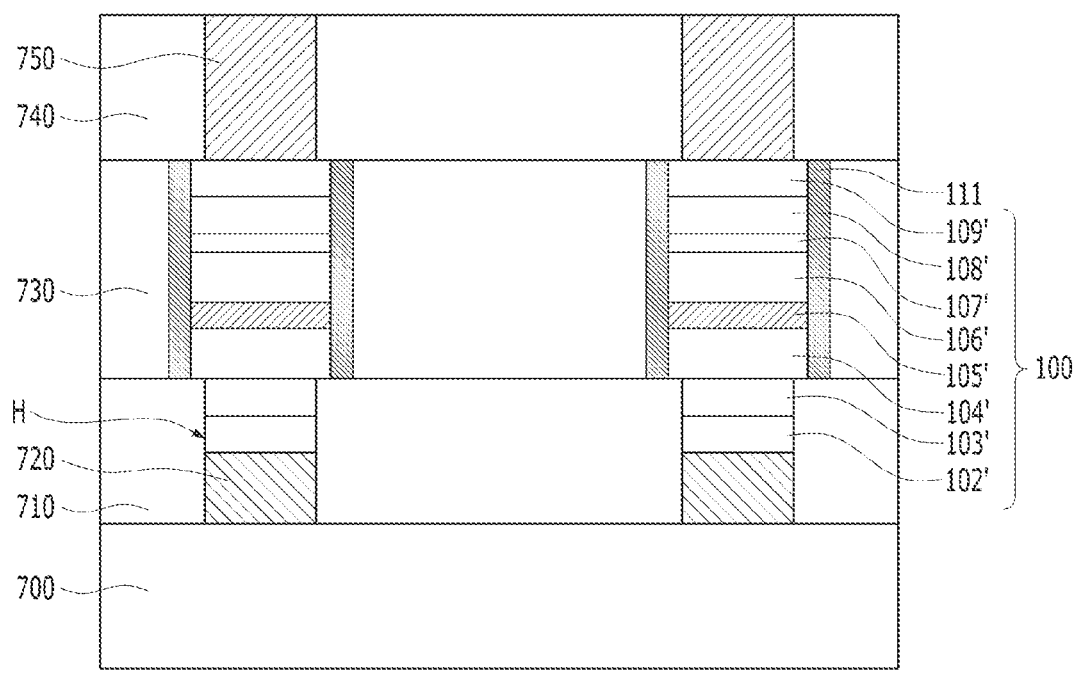
FIG. 7 is a cross-sectional view illustrating another example of the memory device and an example method for fabricating the memory device based on some implementations of the disclosed technology.

A semiconductor memory device as disclosed in this document may include a cell array of variable resistance elements 100 and 200 to store data. The semiconductor memory may further include various components such as lines, elements, etc. to drive or control each of the variable resistance elements 100 and 200. This is exemplarily explained with reference to FIGS. 6 and 7. In FIGS. 6 and 7, the variable resistance element 100 shown in FIGS. 2A to 2E is explained. The similar explanation can be applied to the variable resistance element 200 shown in FIGS. 3A to 3F and FIG. 5 and the variable resistance element 100 shown in FIG. 4.

FIG. 6 is a cross-sectional view for explaining an example of a memory device and an example method for fabricating the memory device based on some implementations of the disclosed technology.

Referring to FIG. 6, the memory device of the implementation may include a substrate 600, lower contacts 620 formed over the substrate 600, variable resistance element 100 formed over the lower contacts 620 and upper contacts 650 formed over the variable resistance element 100. For each variable resistance element 100, a specific structure as a switch or switching circuit/element, for example, a transistor, for controlling an access to a particular variable resistance element 100 can be provided over the substrate 600 to control the variable resistance element 100, where the switch can be turned on to select the variable resistance element 100 or turned off to de-select the variable resistance element 100. The lower contacts 620 may be disposed over the substrate 600, and couple a lower end of the variable resistance element 100 to a portion of the substrate 600, for example, a drain of the transistor as the switching circuit for the variable resistance element 100. The upper contact 650 may be disposed over the variable resistance element 100, and couple an upper end of the variable resistance element 100 to a certain line (not shown), for example, a bit line. In FIG. 7, two variable resistance elements 100 are shown as examples of the elements in an array of variable resistance elements 100.

First, the substrate 600 in which the transistor is formed may be provided, and then, a first interlayer dielectric layer 610 may be formed over the substrate 600. Then, the lower contact 620 may be formed by selectively etching the first interlayer dielectric layer 610 to form a hole H exposing a portion of the substrate 600 and filling the hole H with a conductive material. Then, the variable resistance element 100 may be formed by forming material layers for the variable resistance element 100 over the first interlayer dielectric layer 610 and the lower contact 620, and selectively etching the material layers. The etch process for forming the variable resistance element 100 may include the IBE method which has a strong physical etching characteristic. Then, a second interlayer dielectric layer 630 may be formed to cover the variable resistance element. Then, a third interlayer dielectric layer 640 may be formed over the variable resistance element 100 and the second interlayer dielectric layer 630, and then upper contacts 650 passing through the third interlayer dielectric layer 640 and coupled to an upper end of the variable resistance element 100 may be formed.

In the memory device based on an implementation, all layers forming the variable resistance element 100 may have sidewalls which are aligned with one another. That is because the variable resistance element 100 is formed through an etch process using one mask.

Unlike the implementation of FIG. 6, a part of the variable resistance element 100 may be patterned separately from other parts. This process is illustrated in FIG. 7.

FIG. 7 is a cross-sectional view for explaining another example of the memory device and its fabrication process based on another implementation of the disclosed technology. The following descriptions will be focused on a difference from the implementation of FIG. 6.

Referring to FIG. 7, the memory device based on an implementation may include a variable resistance element 100 of which parts, for example, a buffer layer 102' and an under layer 103' have sidewalls that are not aligned with other layers thereof. As shown in FIG. 7, the buffer layer 102' and the under layer 103' may have sidewalls which are aligned with lower contacts 720.

The memory device in FIG. 7 may be fabricated by following processes.

First, a first interlayer dielectric layer 710 may be formed over a substrate 700, and then selectively etched to form a hole H exposing a portion of the substrate 700. The, the lower contacts 720 may be formed to fill a lower portion of the hole H. For example, the lower contacts 720 may be formed through a series of processes of forming a conductive material to cover the resultant structure having the hole formed therein, and removing a part of the conductive material through an etch back process until the conductive material has a desired thickness. Then, the buffer layer 102' and the under layer 103' may be formed so as to fill the remaining portion the hole H. For example, the buffer layer 102' may be formed by forming a material layer for forming the buffer layer 102' which covers the resultant structure in which the lower contacts 720 is formed, and then removing a portion of the material layer by, for example, an etch-back process until the material layer has a desired thickness. Moreover, the under layer 103' may be formed by forming a material layer for forming the under layer 103' which covers the resultant structure in which the lower contacts 720 and the buffer layer 102' are formed, and then performing a planarization process such as a CMP (Chemical Mechanical Planarization) until a top surface of the first interlayer dielectric layer 710 is exposed. Then, the remaining parts of the variable resistance element 100 may be formed by forming material layers for forming the remaining layers of the variable resistance element 100 except the buffer layer 102' and the under layer 103' over the lower contacts 720 and the first interlayer dielectric layer 710.

Subsequent processes are substantially the same as those as shown in FIG. 7.

In this implementation, the height which needs to be etched at a time in order to form the variable resistance element 100 can be reduced, which makes it possible to lower the difficulty level of the etch process.

Although in this implementation, the buffer layer 102' and the under layer 103' are buried in the hole H, other parts of the variable resistance element 100 may also be buried as needed.

The above and other memory circuits or semiconductor devices based on the disclosed technology can be used in a range of devices or systems. FIGS. 8 to 12 provide some examples of devices or systems that can implement the memory circuits disclosed herein.

Figure 8:
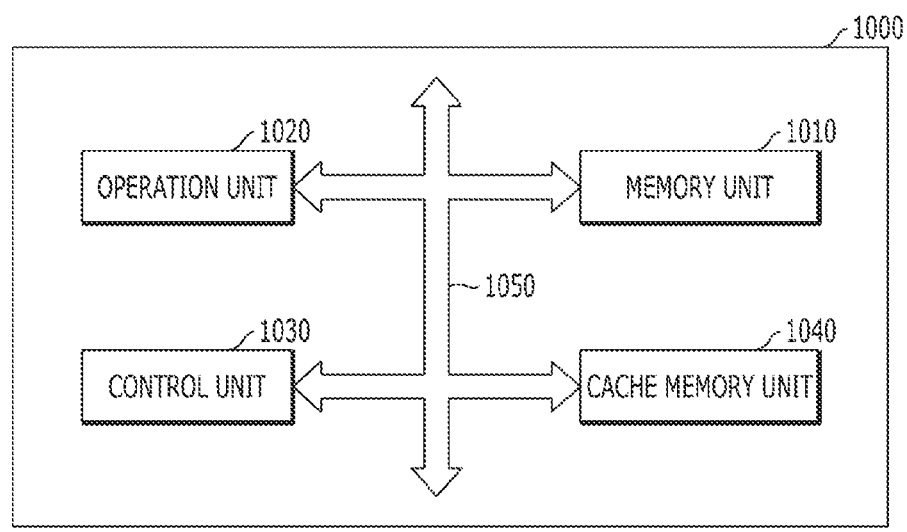
FIG. 8 is an example configuration diagram of a microprocessor including memory circuitry based on an implementation of the disclosed technology.

FIG. 8 is an example configuration diagram of a microprocessor including memory circuitry based on an implementations of the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing circuits such as a central processing unit (CPU), a graphic processing unit (GPU), a digital signal processor (DSP) and an application processor (AP).

The memory unit 1010 is operable to store data in the microprocessor 1000, as a processor register, register. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices based on some implementations. For example, the memory unit 1010 may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof. Through this, data storage characteristics of the memory circuit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
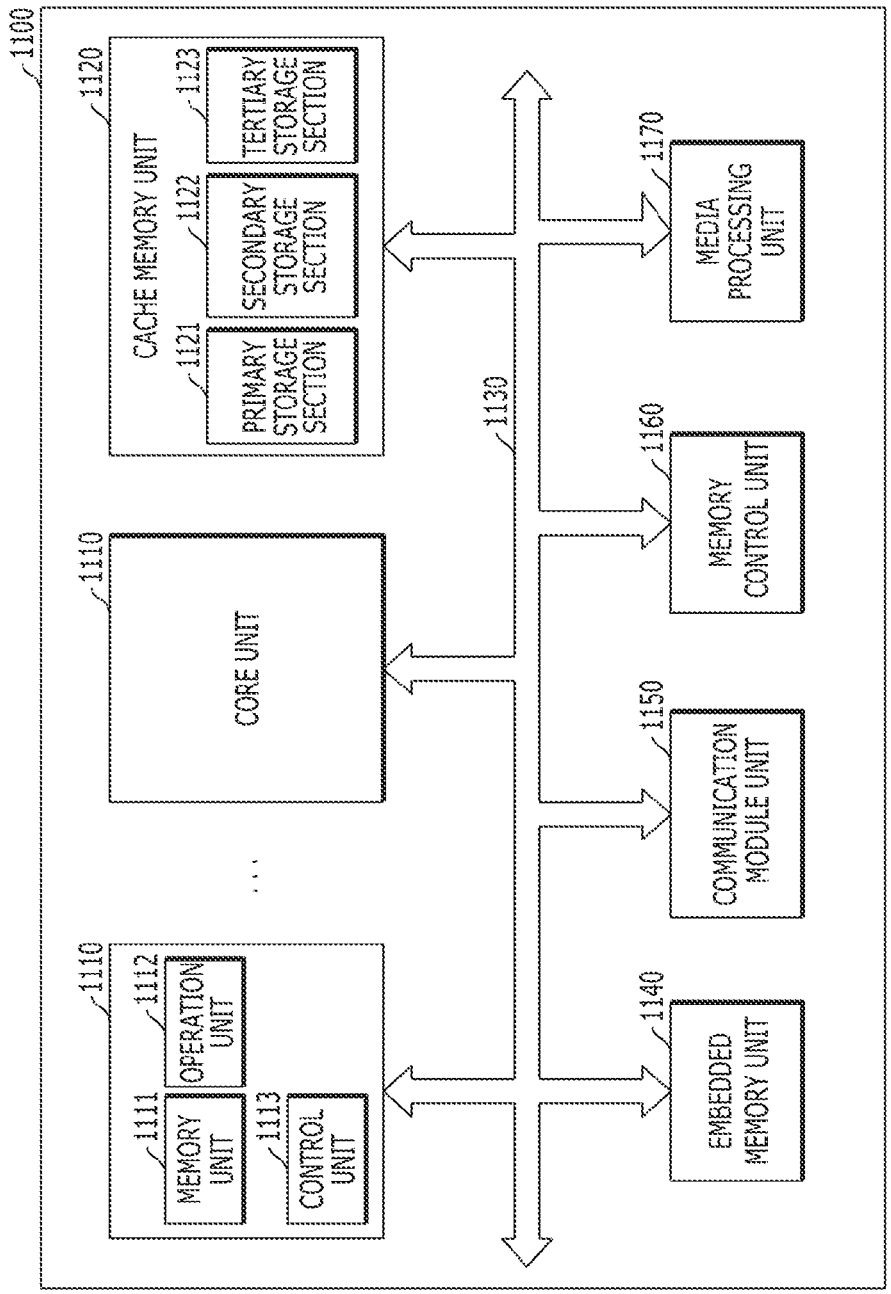
FIG. 9 is an example configuration diagram of a processor including memory circuitry based on an implementation of the disclosed technology.

FIG. 9 is an example of configuration diagram of a processor including memory circuitry based on an implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 is operable to perform arithmetic logic operations for data inputted from an external device, and may include a memory unit 1111, an operation unit 1112 and a control unit 1113.

The memory unit 1111 is operable to store data in the processor 1100, as a processor register, a register. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is configured to perform operations in the processor 1100. The operation unit 1112 may perform four arithmetical operations, logical operations, according to results that the control unit 1113 decodes commands. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is operable to temporarily store data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory circuit 1120 may include one or more of the above-described semiconductor devices based on some implementations. For example, the cache memory unit 1120 may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof. Through this, data storage characteristics of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is operable to connect the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
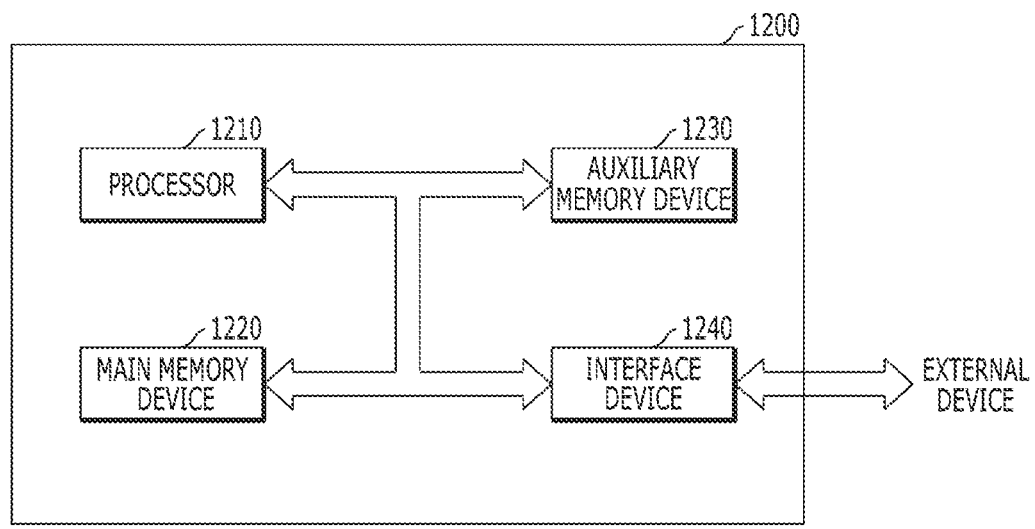
FIG. 10 is an example configuration diagram of a system including memory circuitry based on an implementation of the disclosed technology.

FIG. 10 is an example configuration diagram of a system including memory circuitry based on an implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices based on some implementations. For example, the auxiliary memory device 1230 may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
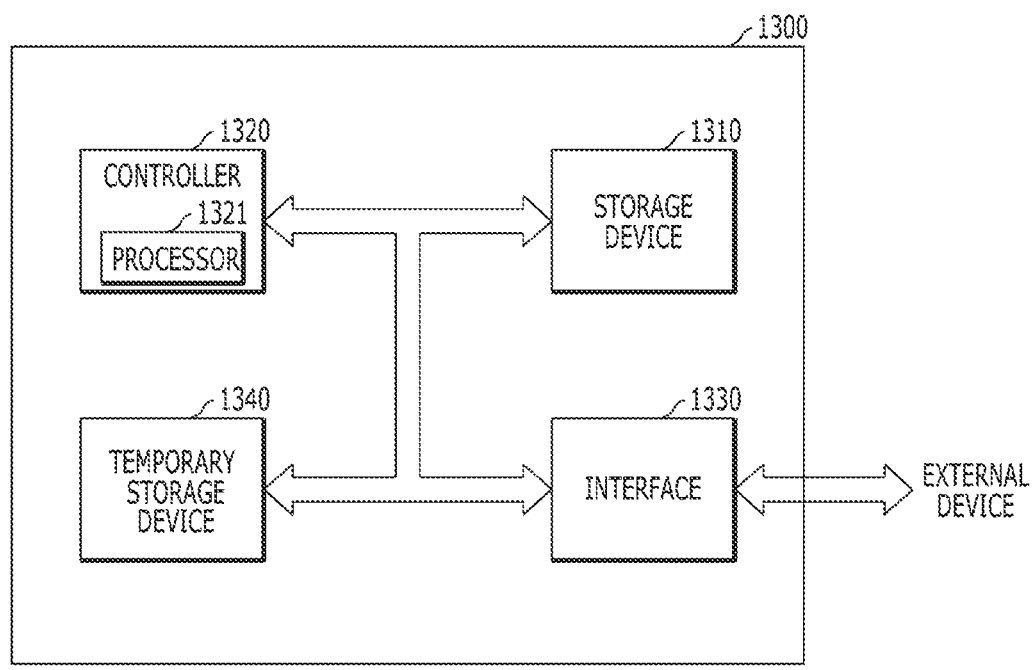
FIG. 11 is an example configuration diagram of a data storage system including memory circuitry based on an implementation of the disclosed technology.

FIG. 11 is an example configuration diagram of a data storage system including memory circuitry based on an implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices based on some implementations. The temporary storage device 1340 may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof. Through this, data storage characteristics of the storage device 1310 or the temporary storage device 1340 may be improved. As a result, operating characteristics and data storage characteristics of the data storage system 1300 may be improved.

Figure 12:
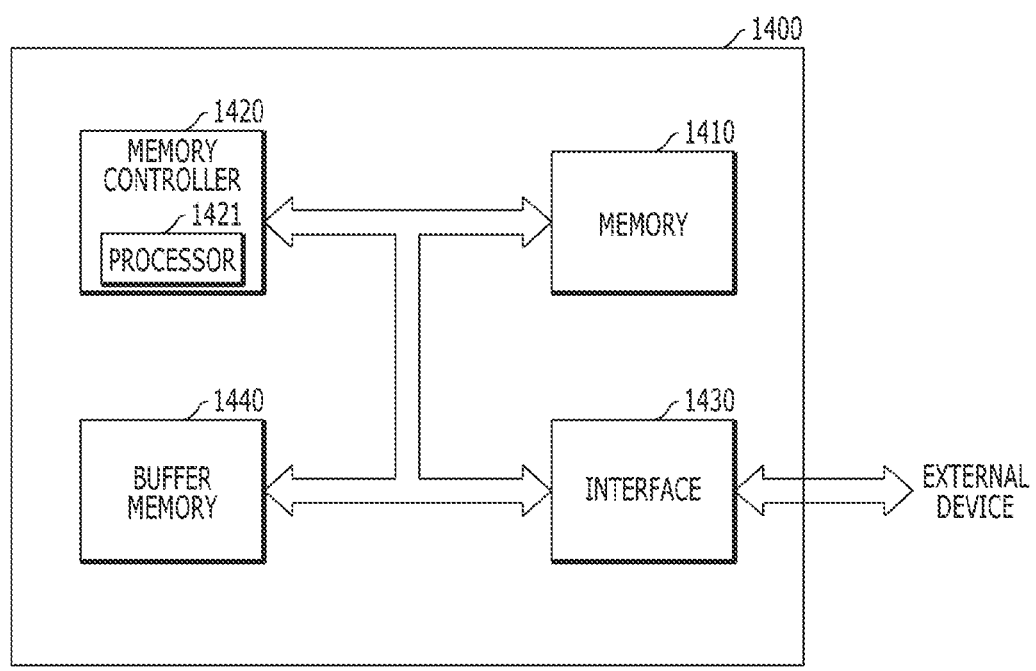
FIG. 12 is an example configuration diagram of a memory system including memory circuitry based on an implementation of the disclosed technology.

FIG. 12 is an example configuration diagram of a memory system including memory circuitry based on an implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices based on some implementations. For example, the memory 1410 may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices based on some implementations. The buffer memory 1440 may include a substrate; a variable resistance element formed over the substrate and exhibiting different resistance values representing different digital information, the variable resistance element including a free layer having a variable magnetization direction, a pinned layer having a fixed magnetization direction and a tunnel barrier layer interposed between the free layer and the pinned layer; and a blocking layer disposed on at least sidewalls of the variable resistance element, wherein the blocking layer may include a layer that is substantially free of nitrogen, oxygen or a combination thereof. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device, the method comprising:
   forming a variable resistance element over a substrate; and
   forming a blocking layer on at least sidewalls of the variable resistance element,
   wherein the blocking layer includes a layer that is substantially free of nitrogen, oxygen or a combination thereof, and
   wherein the blocking layer is structured to block diffusion of gases including O2, H2O, N2 or a combination thereof to the variable resistance element.

2. The method of claim 1, wherein the forming of the blocking layer includes a gas soaking process, and wherein gases used for the gas soaking process include silane ($SiH_4$), trisilyl amine (TSA) or a combination thereof.

3. The method of claim 1, wherein the forming of the blocking layer includes a pre-treatment process and a deposition process, and wherein gases used for the pre-treatment process include hydrogen ($H_2$), ammonia ($NH_3$) or a combination thereof, and gases used for the deposition process include a combination of silane ($SiH_4$), hydrogen ($H_2$) and argon (Ar), or a combination of trisilyl amine (TSA), hydrogen ($H_2$) and argon (Ar).

4. The method of claim 1, further comprising, after forming the blocking layer, performing an ion beam etching (IBE) process on the resultant structure.

5. A method for fabricating an electronic device, the method comprising:
- forming a variable resistance element over a substrate;
- forming a blocking layer on at least sidewalls of the variable resistance element; and
- forming a protective layer on at least sidewalls of the blocking layer,
- wherein the blocking layer includes a layer that is substantially free of nitrogen, oxygen or a combination thereof, and
- wherein the blocking layer is structured to block diffusion of gases including O2, H2O, N2 or a combination thereof to the variable resistance element.

6. The method of claim 5, wherein the forming of the blocking layer includes a gas soaking process, and wherein gases used for the gas soaking process include silane ($SiH_4$), trisilyl amine (TSA) or a combination thereof.

7. The method of claim 5, wherein the forming of the blocking layer includes a pre-treatment process and a deposition process, and wherein gases used for the pre-treatment process include hydrogen ($H_2$), ammonia ($NH_3$) or a combination thereof, and gases used for the deposition process includes a combination of silane ($SiH_4$), hydrogen ($H_2$) and argon (Ar), or a combination of trisilyl amine (TSA), hydrogen ($H_2$) and argon (Ar).

8. The method of claim 5, wherein the protective layer includes a nitride layer, an oxide layer, or a combination thereof.

9. The method of claim 5, wherein the blocking layer is disposed on sidewalls of the variable resistance element and over the variable resistance element, and over an exposed surface of the substrate, and the protective layer is disposed to cover the blocking layer.

10. The method of claim 5, further comprising, after forming the blocking layer, performing an ion beam etching (IBE) process on the resultant structure.

* * * * *